(12) United States Patent
Perner

(10) Patent No.: US 7,123,533 B2
(45) Date of Patent: Oct. 17, 2006

(54) CIRCUIT AND METHOD FOR REFRESHING MEMORY CELLS OF A DYNAMIC MEMORY

(75) Inventor: Martin Perner, Munich (DE)

(73) Assignee: Infineon Technologies AG, Munich (DE)

(*) Notice: Subject to any disclaimer, the term of this patent is extended or adjusted under 35 U.S.C. 154(b) by 163 days.

(21) Appl. No.: 10/881,689

(22) Filed: Jun. 30, 2004

(65) Prior Publication Data

US 2005/0030806 A1 Feb. 10, 2005

(30) Foreign Application Priority Data

Jun. 30, 2003 (DE) ................................ 103 29 369

(51) Int. Cl.
*G11C 7/00* (2006.01)
(52) U.S. Cl. ....................................... 365/222; 365/227
(58) Field of Classification Search ................ 365/222, 365/227
See application file for complete search history.

(56) References Cited

U.S. PATENT DOCUMENTS

| 3,810,129 | A | 5/1974 | Behman et al. |
| 5,890,198 | A | 3/1999 | Pawlowski |
| 6,094,705 | A | 7/2000 | Song |
| 6,167,484 | A * | 12/2000 | Boyer et al. ................ 711/106 |
| 6,205,067 | B1 * | 3/2001 | Tsukude ..................... 365/201 |
| 6,449,685 | B1 * | 9/2002 | Leung ........................ 711/106 |
| 6,483,764 | B1 | 11/2002 | Chen Hsu et al. |
| 6,614,704 | B1 | 9/2003 | Dobler et al. |
| 6,690,606 | B1 * | 2/2004 | Lovett et al. ............... 365/194 |
| 2003/0156483 | A1 | 8/2003 | Feurle et al. |

FOREIGN PATENT DOCUMENTS

| DE | 100 57 275 C1 | 6/2002 |
| DE | 102 06 367 C2 | 12/2003 |
| EP | 0 851 427 A2 | 7/1998 |
| JP | 05101650 A | 4/1993 |
| JP | 09282873 A | 10/1997 |
| WO | WO 98/18130 | 4/1998 |
| WO | WO 00/54159 | 9/2000 |
| WO | WO 02/058072 A2 | 7/2002 |

OTHER PUBLICATIONS

"Infineon Technologies and Micron Technology Announce Cooperation to Develop 'CellularRAM,'" Joint News Release by Infineon and Micron, Munich, Germany/Boise, Idaho, USA, Jun. 24, 2002.

Ohsawa, T., et al., "Optimizing the DRAM Refresh Count for Merged DRAM/Logic LSIs," Proceedings of Intenrational Symposium on Low Power Electronics and Design, 1998, pp. 82-87.

* cited by examiner

*Primary Examiner*—M. Tran
(74) *Attorney, Agent, or Firm*—Slater & Matsil, L.L.P.

(57) ABSTRACT

A circuit for refreshing memory cells of a dynamic memory contains a refresh control circuit for driving a memory cell array for accessing memory cells of the dynamic memory for a refresh process. Furthermore, a storage circuit is provided, which is assigned to at least one of the memory cells, for storing a time information item with regard to a last previous access to the assigned memory cell during the operation of the memory, a register bit being set in a manner dependent on the stored time information item and being able to be evaluated for controlling a refresh process. The refresh control circuit calls up the time information item stored in the storage circuit during operation of the memory and accesses the memory cell array in such a way that the memory cell assigned to the storage circuit is refreshed in a manner dependent on the time information item.

17 Claims, 3 Drawing Sheets

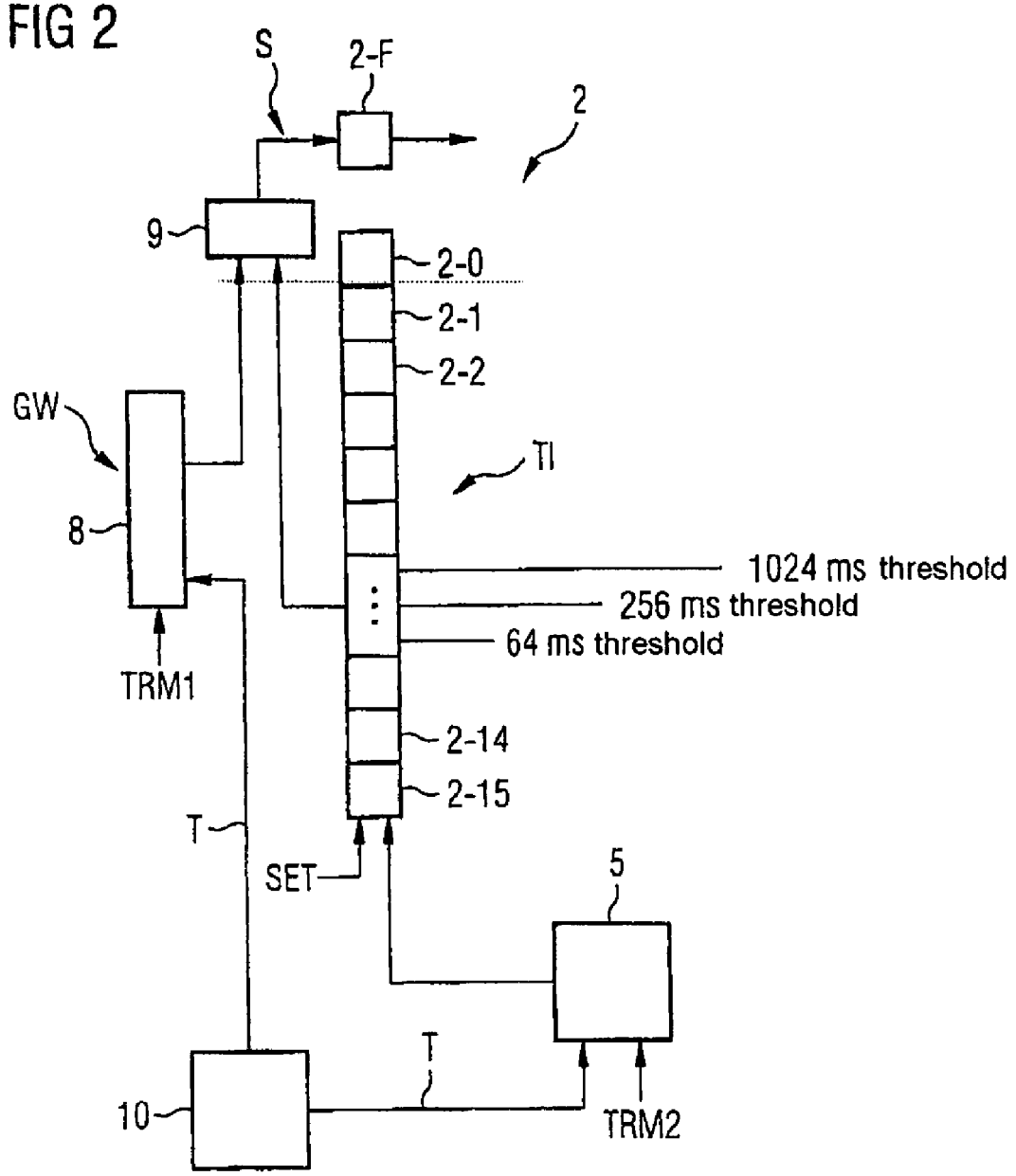

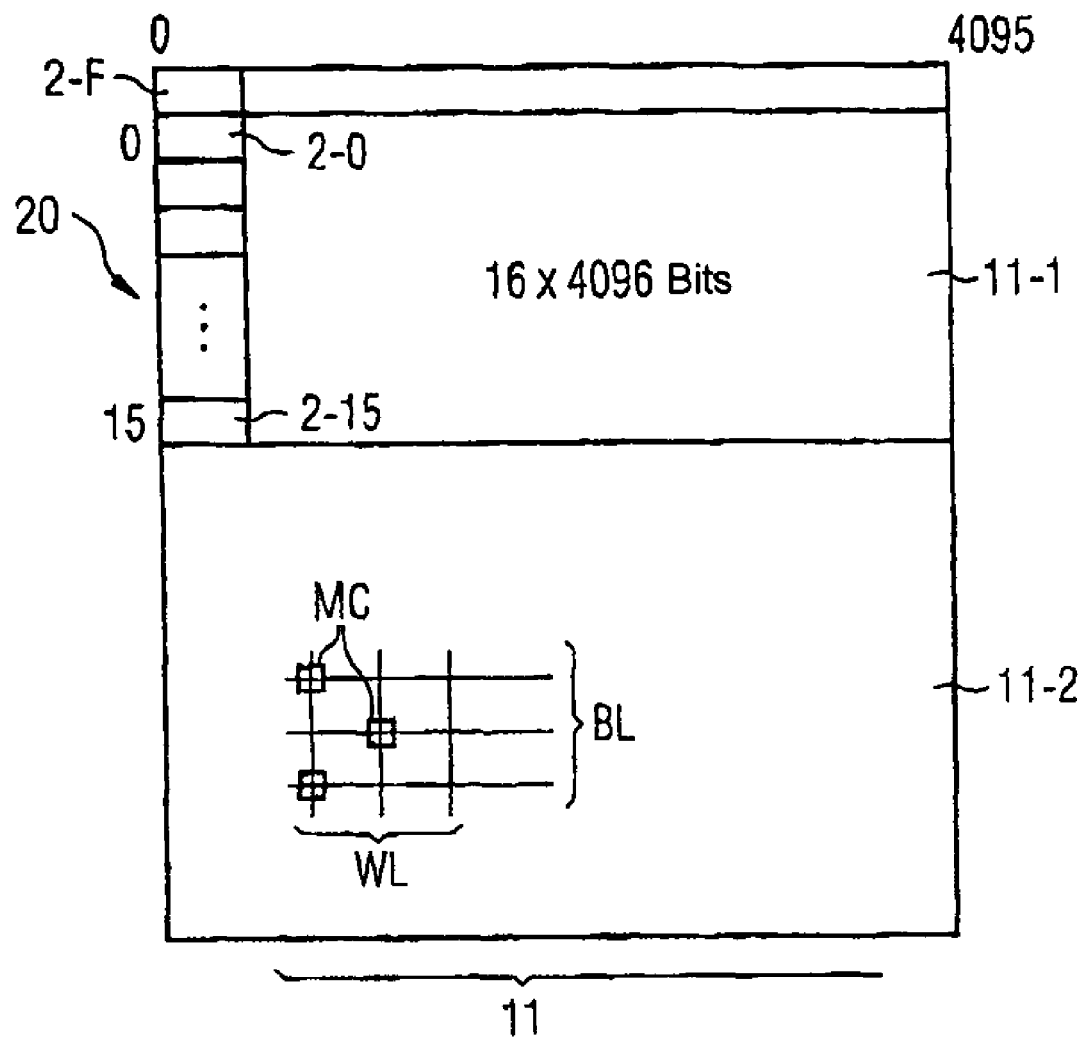

US 7,123,533 B2

CIRCUIT AND METHOD FOR REFRESHING MEMORY CELLS OF A DYNAMIC MEMORY

This application claims priority to German Patent Application 103 29 369.8, which was filed Jun. 30, 2003 and is incorporated herein by reference.

CROSS-REFERENCE TO RELATED APPLICATIONS

This application relates to the following and commonly assigned patent application Ser. No. 10/881,706, filed Jun. 30, 2004, entitled "Circuit and Method for Refreshing Memory Cells of a Dynamic Memory," now U.S. Pat. No. 6,999,369, which application is incorporated herein by reference.

TECHNICAL FIELD

The present invention relates to a circuit for refreshing memory cells of a dynamic memory having a refresh control circuit for driving a memory cell array for accessing memory cells of the dynamic memory for a refresh process. The invention furthermore relates to a method for refreshing memory cells of a dynamic memory.

BACKGROUND

In integrated dynamic memories in the form of DRAMs, a so-called refresh operation is necessary in operating times in which memory cells are not accessed externally, in order to refresh the memory cell content, which can volatilize for example due to leakage currents of the storage capacitor or selection transistor, and thus to permanently retain said memory cell content. During the refresh operation, the assessed and amplified data signals from selected memory cells are written back directly to the relevant memory cells. This is generally controlled by a controller circuit, which additionally defines a refresh frequency with which a respective refresh of the memory cell content is effected.

There are a number of possibilities for refreshing the content of memory cells. Firstly, during a normal operation of the memory for carrying out read or write operations, as early as with the activation of a wordline of the memory and which the subsequent closing of the wordline, the information read from the relevant memory cells is assessed and amplified in sense amplifiers, the assessed and amplified information being written back to the memory cells and refreshed in this way (normal so-called activate-precharge cycle).

Furthermore, the memory controller sends so-called autorefresh commands to the memory, which in each case initiate a command sequence for activating a row due for refreshing. By way of example, a so-called refresh counter defines which of the rows is due for refreshing, the refresh counter successively addressing the rows of the dynamic memory for example in a sequential sequence of their addresses. Such a refresh process is often effected in parallel in all the memory banks of the memory in that a row is in each case activated and closed again simultaneously in each memory bank. If a memory bank has 4096 rows, for example, the memory controller that drives the memory sends an autorefresh command to the memory every 64 ms/4096 (the date retention time is 64 ms), for example.

For the purpose of data retention, the memory may enter a so-called self-refresh mode, in which a refresh counter periodically internally initiates a command sequence for activation and for closing of a row of the memory, similarly to an autorefresh command described previously. The data of memory cells can thus be refreshed regularly even without an external autorefresh command of a memory controller.

A memory controller which controls the accesses to the dynamic memory has the task, inter alia, of ensuring that none of the rows of the memory is in the non-activated state for longer than the maximum specified data retention time, for example 64 ms. In the simplest case, the memory controller intersperses an autorefresh command between the normal read and write operations on average every 15.6 µs (=64 ms/4096). The term used in this case is distributed refreshes, which can be implemented only when the memory is not in a read or write mode.

What is disadvantageous about this type of distributed refresh is, in particular, that it is not possible to define when a distributed refresh is to be effected, since the points in time depend on the access capacity utilization. A high access capacity utilization during read and write operations of the memory would on the other hand mean, however, that a multiplicity of rows are opened and closed again anyway during active operation, so that the information items are already refreshed during the customary read and write operations. In this case, the autorefresh commands are sent to the memory as a precaution in a regular sequence in a supporting manner, in which case a data stream interruption of normal read and write operations also occurs.

SUMMARY OF THE INVENTION

The present invention specifies a circuit and a method for refreshing memory cells of a dynamic memory, which enable the number and thus the frequency of the memory refreshes largely to be reduced during operation of the memory in a data processing system.

In the case of the circuit according to the invention for refreshing memory cells of a dynamic memory, in the memory cells, it is possible to store an information item for a duration of a data retention time, and it is refreshed again in the context of a read, write and refresh operation of the dynamic memory. The circuit has a refresh control circuit for driving a memory cell array for accessing memory cells of the dynamic memory for a refresh process. Moreover, it comprises a storage circuit, which is assigned to at least one of the memory cells, for storing a time information item with regard to a last previous access to the memory cell assigned to the storage circuit during the operation of the memory. Furthermore, the storage circuit contains a register for storing a register bit. In this case, the time information item stored in the storage circuit is altered, proceeding from an initial value, in such a way that the register bit of the storage circuit is set at the latest after the data retention time of the memory cell assigned to the storage circuit has elapsed. The refresh control circuit evaluates the register bit of the storage circuit and accesses the memory cell array in the case of a set register bit in such a way that the memory cell assigned to the storage circuit is refreshed. What is more, the time information item stored in the storage circuit is reset to the initial value after a read, write and refresh operation at the memory cell assigned to the storage circuit and the register bit of the storage circuit is erased again.

Thus, according to the invention, during operation of the memory, a time information item with regard to a last previous access to at least one of the memory cells is assigned thereto and stored, in which case, in order to control a refresh process of one of the memory cells. During operation of the memory, the respectively assigned time information item is evaluated on the basis of the register bit and the refresh process is carried out in a manner dependent on the time information item. It is thus possible for a memory controller, for example, to ascertain when a memory cell or a unit of memory cells in the form of a row, for example, was activated the last time, so that the next refresh process can be initiated in a manner dependent thereon. This makes it possible, during operation of the memory, to flexibly adapt the number and thus the frequency of the memory refreshes to the maximum data retention time of the memory cells that is guaranteed by the manufacturer, and thus largely to reduce the number and frequency of memory refreshes to a minimum.

In accordance with an advantageous embodiment of the invention, the storage circuit is assigned to one of a plurality of units of memory cells of the dynamic memory, for example a row of the memory, a plurality of the memory cells in each case being selectable with the units of memory cells. In this case, the refresh control circuit accesses the memory cell array in such a way that the memory cells of the unit of memory cells which is assigned to the storage circuit are refreshed in a manner dependent on the time information item stored in the storage circuit.

The circuit for refreshing memory cells of a dynamic memory according to the invention may be used for example in the refresh control of the dynamic memory itself or in a refresh control of the memory controller that drives the memory. Distributed arrangements of respective subcircuits on the memory controller and on the dynamic memory are also possible, which interact in the manner according to the invention for refreshing memory cells of the dynamic memory. It is furthermore conceivable to provide a dedicated chip for the circuit according to the invention, which chip is provided for instance on a memory module.

BRIEF DESCRIPTION OF THE DRAWINGS

The invention is explained in more detail below with reference to the figures, which are illustrated in the drawing and illustrate exemplary embodiments with respect to the present invention.

FIG. 2 shows an embodiment of a subcircuit of a circuit for refreshing memory cells of a DRAM according to the invention; and FIG. 3 shows a schematic overview of a memory bank of a DRAM with a storage circuit according to the invention.

DETAILED DESCRIPTION OF ILLUSTRATIVE EMBODIMENTS

Figure 1:
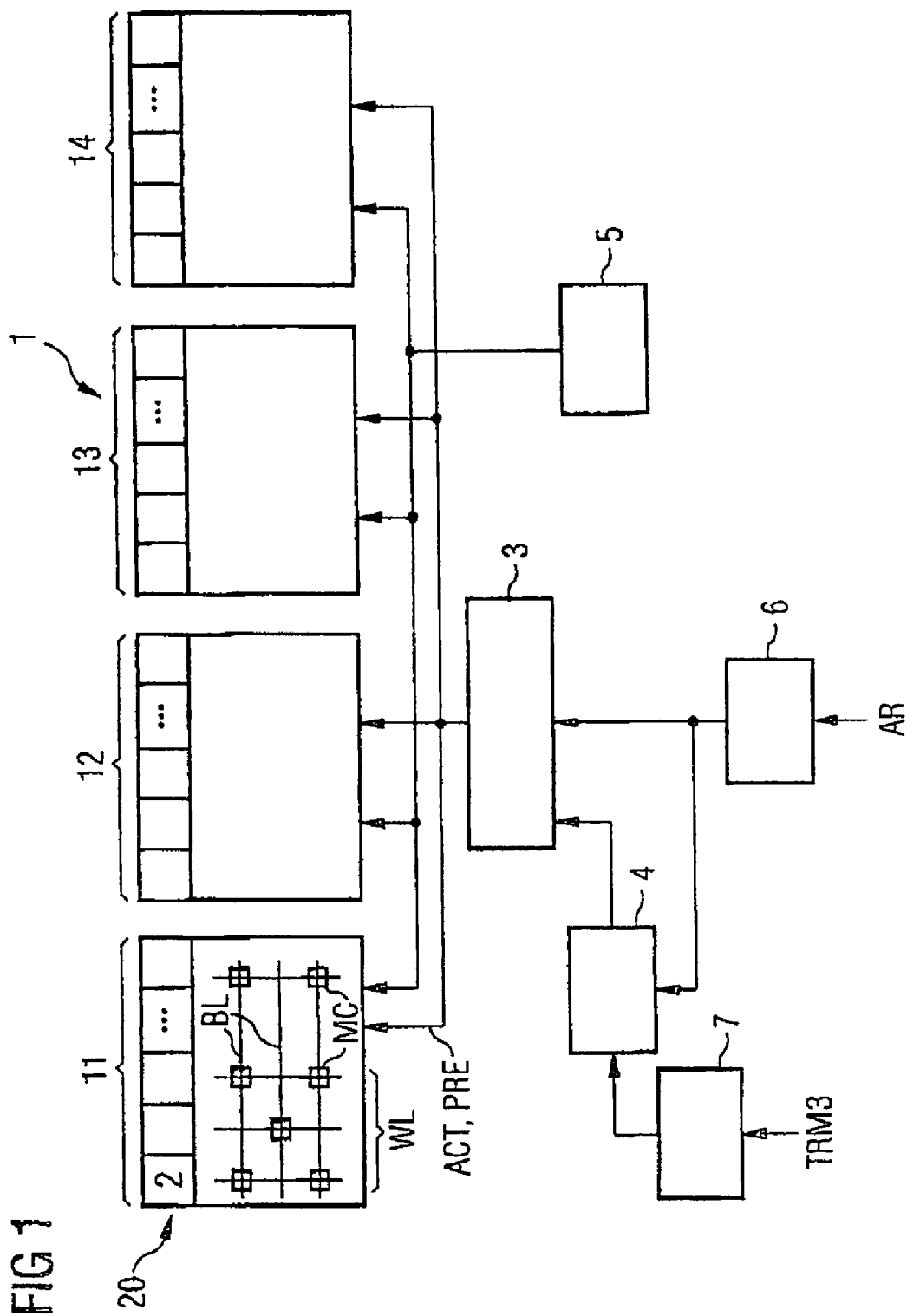
FIG. 1 shows an embodiment of a circuit for refreshing memory cells of a DRAM according to the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 shows an embodiment of a circuit for refreshing memory cells of a DRAM according to the invention. The memory has a memory cell array 1, which is subdivided into a plurality of memory banks 11 to 14 of identical type. In this case, the memory cells MC are arranged along wordlines WL (rows) and bitlines BL (columns). The memory cells MC are arranged at crossover points of the bitlines and wordlines and in each case comprise a storage capacitor, which is connected to one of the bitlines via a selection transistor. In this case, for reasons of clarity, the selection transistor and the storage capacitor of a respective memory cell MC are not illustrated in FIG. 1. For the selection of one of the memory cells MC, the respective selection transistor is turned on by an activated wordline WL, as a result of which a data signal of the selected memory cell can subsequently be read out or written by means of a sense amplifier (likewise not illustrated in FIG. 1). The data signal of the selected memory cell is present on the relevant bitline BL and is assessed and amplified by the sense amplifier.

For a refresh process, the data signals assessed and amplified by the respective sense amplifier are written back directly to the relevant memory cells MC. A refresh control circuit is provided for this purpose, as will be described in more detail hereinbelow. During a refresh process, a current consumption is necessary in particular as a result of the respectively required activation of sense amplifiers, which current consumption correlates with the refresh frequency. In the interests of a minimum current consumption, therefore, it is an aim to dimension the time duration between two refresh cycles to be as long as possible, so that the refresh frequency is as low as possible. In this case, the maximum achievable data retention time of the memory cells is crucial for determining the time duration required between two refresh cycles. It is influenced particularly by leakage currents in the storage capacitor and/or selection transistor, which increase with increasing memory temperatures.

Furthermore, in accordance with FIG. 1, provision is made of a memory area 20 with storage circuits 2 which are respectively assigned to one of the wordlines WL of the memory. A time information item with regard to a last previous access to the assigned row of the memory is stored in the storage circuits 2, the construction of which will be explained in more detail in particular with reference to FIG. 2. In particular, the storage circuit 2 contains a counter register (not illustrated in FIG. 1) for storing bit information item with which the time information item is stored. Furthermore, in accordance with the embodiment as shown in FIG. 1, an oscillator 5 is provided, which is connected to the respective counter register of the storage circuit 2, for incrementing or decrementing the counter register with a defined clock rate.

An access controller 3 serves for driving each of the memory banks 11 to 14 of the memory cell array 1 for accessing memory cells MC. Furthermore, a command decoder 6 is provided, which receives command sequences, for example from a memory controller, for read and write operations of the memory and also, in particular, auto refresh commands AR, an auto refresh command resulting in the initiation of a command sequence for carrying out a so-called distributed refresh by the command decoder 6. The command decoder 6 also drives a selection circuit 4 in the form of a refresh counter in order to select the row due for a next refresh process. For this purpose, the row address of the row that is to be selected next for a refresh process is stored in the refresh counter. For incrementing or decrementing the row address stored in the refresh counter of the selection circuit 4, the latter is driven by an oscillator 7. In order to activate a row for a refresh process, the access controller 3 sends an activation command ACT for opening the row and for reading the memory cells along the row to each memory bank. A selected row is closed by means of a precharge command PRE.

FIG. 2 shows an embodiment of a subcircuit of the circuit in accordance with FIG. 1 in a more detailed view. The storage circuit 2 is embodied in the form of a register with 16 bits 2-0 to 2-15, for example, in which the time information item TI with regard to a last previous access to the assigned row of the memory is stored. Furthermore, the storage circuit 2 has a register for storing a register bit 2-F, which is set in a manner dependent on the time information items TI stored with the bits 2-0 to 2-15 and can be read out by the refresh control circuit according to the invention. The register with the bits 2-0 to 2-15 of the storage circuit 2 is embodied in the form of a counter register which is driven by the oscillator 5 for incrementing or decrementing the time information item TI stored in the counter register with a defined clock rate. In this case, the clock rate of the oscillator 5 can be set externally be a trimming signal TRM2.

In a joint consideration with FIG. 1, according to the invention, for the case where each of the memory banks 11 to 14 has 4096 rows, a memory area 20 having a size of 4·4096·(16+1)=(256+16) kb is reserved in order to detect and store for each row of the memory individually a time information item with regard to a last previous access to the respective row. In this case, the register for storing the bits 2-0 to 2-15 may be operated like a binary counter. Furthermore, all the storage circuits 2 of the memory area 20 may be incremented or decremented by the step 1, for example, simultaneously and in parallel. Each of the storage circuits 2 may be reset individually upon activation of the respective assigned row.

Furthermore, in accordance with the embodiment as shown in FIG. 2, provision is made of a limit value memory 8 for storing a limit value GW, which limit value memory is embodied for example in the form of a PROM. The limit value memory 8 can be programmed with a defined value externally by a trimming signal TRM1. A comparison circuit 9 is connected to the limit value memory 8 and to the storage circuit 2 in order to compare the time information item TI stored in the storage circuit 2 with the limit value GW of the limit value memory 8. The comparison circuit 9 provides an output signal S, which is activated in a manner dependent on the comparison between the time information item TI and the limit value GW. The register bit 2-F is set in a manner dependent on the state of the output signal S, and can be called up by the refresh control circuit according to the invention. The latter initiates a refresh process if the time information item TI has reached the temporal limit value GW, as a result of which the register bit 2-F is set.

During operation of the circuit according to the invention for refreshing memory cells, the storage circuit 2 is preallocated during the initialization by means of the signal SET for example in such a way that all the bits 2-0 to 2-15 are set to "1". Equally, during an individual access to the assigned row of the memory, all the corresponding 16 bits 2-0 to 2-15 are set to "1", for example. Thus, the storage circuit 2 is preallocated an initial value in the event of each access to the assigned row, but, as an alternative to this, may also be reset to an initial value. After an access to the assigned row, the time information item TI stored in the storage circuit 2 is incremented or decremented progressively by the oscillator 5, depending on the initial value, the assigned row being refreshed in the case where the limit value GW is reached. The storage circuit 2 is incremented or decremented here in each case by the step 1, for example. An oscillator 5 trimmed to 1 ms would be advantageous in this connection since the time information item TI directly indicates the time unit milliseconds in this case. This would be advantageous primarily when the bits 2-0 to 2-15 are read out directly for analysis purposes, for example. Thus, the 16 bit wide register could represent a time period of 65535 ms, so that a data retention time of up to 65 seconds can be detected. After decrementing, in the event of an access to the assigned row, by means of the PRE command, by way of example, each of the bits 2-0 to 2-15 is again allocated the value "1", so that the maximum value 65535 is once again set.

As an alternative to this, it would also be possible to start with the bits 2-0 to 2-15 at a preset threshold, for example at 64 ms, 256 ms or 1024 ms, so that individual start values are stored in the storage circuit 2. The threshold values could be preset for example in a so-called front end test operation during the testing of the memory, by fixed programming of the most or least significant bits of the storage circuit 2. For this purpose, the corresponding bits of the storage circuit 2 would be permanently preallocated "0" or "1", for example by severing a fuse or the like. The register bit 2-F would be set with a value when the storage circuit 2 functioning as a binary counter has counted down to zero.

The circuit in accordance with FIG. 2 furthermore has a temperature sensor circuit 10 for detecting a temperature of the dynamic memory. In this case, the clock rate of the oscillator 5 can be set by a control signal T of the temperature sensor circuit 10 in a manner dependent on the temperature of the memory. Furthermore, in addition or as an alternative to this, the limit value memory 8 can also be driven by the control signal T of the temperature sensor circuit 10 in order to set the value that can be programmed in the limit value memory 8 in a manner dependent on the temperature of the memory. This advantageously makes it possible to take account of the dependence of the data retention time on the memory temperature. Furthermore, it would be possible, in principle, to regulate the clock rate of the oscillator 7 in accordance with FIG. 1 in a temperature-dependent manner. A temperature-dependent preallocation of a temperature-dependent initial value to the storage circuit 2 would also be conceivable, in principle.

As already described in more detail above, during production, for example, it is possible to establish the maximum data retention time during the front end test operation for each memory, each memory area or else each memory row. As illustrated in FIG. 2, for example, the respective storage circuits 2 with the associated evaluation circuit may be set in device-specific fashion, whether it be by trimming the clock rate of the oscillator 5 by means of the signal TRM2, by trimming the clock rate of the oscillator 7 in accordance with FIG. 1 by means of the signal TRM3, by trimming the limit value memory 8 by means of the signal TRM1, or by setting individual initial threshold values within the storage circuit 2. The respective trimming signals could for example be set by programming electrical fuses, so that even an alteration of the trimming signals during operation of the memory in the application is made possible, in principle, for example if the data retention time deteriorates over the operating life of the memory. It would thus be possible to have the effect of setting the register bit 2-F correspondingly earlier.

FIG. 3 shows by way of example a schematic overview of the memory bank 11 of a DRAM in accordance with FIG. 1, in which the individual storage circuits with the bits 2-0 to 2-15 and the register bit 2-F are arranged in a dedicated memory area 11-1. The memory cells MC for storing the data signals of the memory for read and write operations are arranged in the memory area 11-2. In accordance with a numerical example, the memory area 11-1 (with 4096 rows within the memory bank 11) encompasses a size of 16×4096 bits. 4096 register bits 2-F are additionally provided.

Although the present invention and its advantages have been described in detail, it should be understood that various changes, substitutions and alterations can be made herein without departing from the spirit and scope of the invention as defined by the appended claims.

What is claimed is:

1. A memory circuit comprising;
   an array of memory cells, each memory cell operable to store an information item for a duration of a data retention time, the information item stored in the memory cells being refreshed in the context of a read, write and refresh operation;
   a refresh control circuit for driving a memory cell array to access ones of the memory cells for a refresh process; and
   a storage circuit, which is assigned to at least one of the memory cells, for storing a time information item with regard to a last previous access to the memory cell assigned to the storage circuit during the operation of the memory, the storage circuit having a register for storing a register bit;
   wherein the time information item stored in the storage circuit is altered, proceeding from an initial value, in such a way that the register bit of the storage circuit is set at the latest after the data retention time of the memory cell assigned to the storage circuit has elapsed;
   wherein the refresh control circuit evaluates the register bit of the storage circuit and accesses the memory cell array in the case of a set register bit in such a way that the memory cell assigned to the storage circuit is refreshed; and
   wherein the time information item stored in the storage circuit is reset to the initial value after a read, write and refresh operation at the memory cell assigned to the storage circuit and the register bit of the storage circuit is erased.

2. The circuit as claimed in claim 1 wherein the storage circuit is assigned to one of a plurality of groups of memory cells of the dynamic memory, a plurality of the memory cells in each case being selectable with the groups of memory cells, and wherein the refresh control circuit accesses the memory cell array in such a way that the memory cells of the group of memory cells that is assigned to the storage circuit are refreshed in a manner dependent on the time information item.

3. The circuit as claimed in claim 1 wherein the storage circuit includes a counter register, the circuit further comprising an oscillator, which is coupled to the counter register for incrementing or decrementing the counter register with a defined clock rate.

4. The circuit as claimed in claim 3 wherein the clock rate of the oscillator can be set externally by a trimming signal.

5. The circuit as claimed in claim 3 and further comprising a temperature sensor circuit for detecting a temperature of the dynamic memory, wherein the clock rate of the oscillator can be set by a control signal of the temperature sensor circuit in a manner dependent on the temperature of the dynamic memory.

6. The circuit as claimed in claim 1 and further comprising:
   a limit value memory for storing a limit value; and
   a comparison circuit coupled to the limit value memory and to the storage circuit, the comparison circuit providing an output signal that is activated in a manner dependent on a comparison between the time information item of the storage circuit and the limit value of the limit value memory, wherein a state of the output signal of the comparison circuit can be called up by the refresh control circuit.

7. The circuit as claimed in claim 6 wherein the limit value memory can be programmed with a defined value externally by a trimming signal.

8. The circuit as claimed in claim 6 and further comprising a temperature sensor circuit for detecting a temperature of the dynamic memory, wherein the limit value memory can be programmed with a defined value by a control signal of the temperature sensor circuit in a manner dependent on the temperature of the dynamic memory.

9. A method for refreshing memory cells of a dynamic memory, the method comprising:
   storing information items in various memory cells of the dynamic memory, wherein each cell is capable of retaining the information item for a data retention time;
   accessing at least one of the memory cells in which an information item has been stored;
   storing a time information item with regard to a last previous access to the at least one of the memory cells;
   altering the time information item and setting a register bit at the latest after the data retention time has elapsed;
   refreshing the at least one of the memory cells assigned to the time information item when the register bit is set; and
   resetting the time information item assigned to the at least one of the memory cells after either a read, write and refresh operation at the memory cell and after the register bit is erased.

10. The method as claimed in claim 9 wherein the refresh process is carried out if the time information item reaches a limit value.

11. The method as claimed in claim 9 wherein the time information item is stored in a storage circuit.

12. The method as claimed in claim 11 wherein, in the event of an access to the memory cell to which the time information item is assigned, the storage circuit is preallocated an initial value or is reset to an initial value.

13. The method as claimed in claim 12 wherein the time information item stored in the storage circuit is progressively incremented or decremented, the memory cell being refreshed in the case where a defined limit value is reached.

14. The method as claimed in claim 13 wherein and further comprising receiving the defined limit value memory from a source external to the dynamic memory.

15. The method as claimed in claim 9 wherein the time information item is set in a manner dependent on a temperature of the memory.

16. The method as claimed in claim 9 wherein the time information item is accessed in a manner dependent on a temperature of the memory.

17. A method for refreshing memory cells of a dynamic memory, the method comprising:
   storing information items in various memory cells of the dynamic memory, wherein each cell is capable of retaining the information item for a data retention time;
   accessing at least one of the memory cells in which an information item has been stored;
   storing a time information item with regard to a last previous access to the at least one of the memory cells, wherein the time information item is stored in a storage circuit;
   altering the time information item and setting a register bit at the latest after the data retention time has elapsed;

refreshing the at least one of the memory cells assigned to the time information item when the register bit is set; and resetting the time information item assigned to the at least one of the memory cells after either a read, write and refresh operation at the memory cell or after the register bit is erased;

wherein, in the event of an access to the memory cell to which the time information item is assigned, the storage circuit is preallocated an initial value or is reset to an initial value; and wherein the time information item stored in the storage circuit is progressively incremented or decremented, the memory cell being refreshed in the case where a defined limit value is reached.

* * * * *